(12) United States Patent
Peterson et al.

(10) Patent No.: US 11,437,742 B2
(45) Date of Patent: Sep. 6, 2022

(54) FLEXIBLE PRINTED CIRCUITS MARKED WITH CONNECTIONS TO VEHICLE CIRCUITS

(71) Applicant: APTIV TECHNOLOGIES LIMITED, St. Michael (BB)

(72) Inventors: David R. Peterson, Aurora, OH (US); Joseph Sudik, Jr., Niles, OH (US)

(73) Assignee: APTIV TECHNOLOGIES LIMITED, St. Michael (BB)

( * ) Notice: Subject to any disclaimer, the term of this patent is extended or adjusted under 35 U.S.C. 154(b) by 0 days.

(21) Appl. No.: 17/124,006

(22) Filed: Dec. 16, 2020

(65) Prior Publication Data

US 2021/0210878 A1 Jul. 8, 2021

Related U.S. Application Data

(60) Provisional application No. 62/956,911, filed on Jan. 3, 2020.

(51) Int. Cl.
| | |
|---|---|
| *H05K 1/02* | (2006.01) |
| *H01R 12/61* | (2011.01) |
| *H01R 12/65* | (2011.01) |

(52) U.S. Cl.
CPC ............ *H01R 12/61* (2013.01); *H01R 12/65* (2013.01); *H05K 1/0269* (2013.01); *H05K 2201/09927* (2013.01); *H05K 2201/09936* (2013.01)

(58) Field of Classification Search
CPC .... H05K 1/0213; H05K 1/0269; H01R 12/61; H01R 12/65
See application file for complete search history.

(56) References Cited

U.S. PATENT DOCUMENTS

| | | | | |
|---|---|---|---|---|
| 7,304,239 | B1 * | 12/2007 | Harris | H02G 11/00 |
| | | | | 174/135 |
| 2018/0198218 | A1 * | 7/2018 | Regan | H01R 9/2475 |

* cited by examiner

*Primary Examiner* — Jeremy C Norris
(74) *Attorney, Agent, or Firm* — RMCK Law Group, PLC

(57) ABSTRACT

Flexible circuits are described including markings that indicate connections between their flat-wire conductors and specific circuits of a vehicle electrical system. Wire conductors within the flexible circuit share connections with different circuits of the vehicle electrical system. To indicate a connection between a wire conductor and a vehicle circuit, the flexible circuit includes one or more human or machine-readable marks specifically indicating the connection, in some cases, at a position where the connection is to be made. The marks can include etchings or printings on the wire conductors or printings on or otherwise visible from the insulating body that protects the wire conductors.

20 Claims, 6 Drawing Sheets

FLEXIBLE PRINTED CIRCUITS MARKED WITH CONNECTIONS TO VEHICLE CIRCUITS

CROSS-REFERENCE TO RELATED APPLICATION(S)

The present application claims the benefit of U.S. Application No. 62/956,911, filed on Jan. 3, 2020. The disclosure of this application is incorporated herein by reference in its entirety.

FIELD

The present application generally relates to flexible circuits and, more particularly, to flexible circuits marked with connections to vehicle circuits.

BACKGROUND

Modern vehicles include many complex electrical circuits. Flat-wire, flexible circuits provide a lighter and cheaper alternative to traditional wire harnesses for interconnecting electrical circuits. These flexible circuits consist of flat-wire conductors protected by an insulating body. Each flat-wire conductor may be hard to distinguish from the next, making it difficult to correctly identify connections to at least some circuits of the vehicle during service and assembly.

SUMMARY

This disclosure describes flexible circuits for vehicle electrical systems that include markers indicating connections between individual conductors of the flexible circuits and specific circuits of the vehicle electrical systems. The markers provide a visual aid to humans or machines for accurately locating connections between individual wire conductors and particular circuits of the vehicle electrical system. Each individual flat-wire conductor can be marked as being part of a particular circuit. The wire conductor can be marked more precisely by marking it at a specific position along the wire conductor where a connection to the particular circuit is made. As electrical systems in vehicles increase in complexity, assembly and service times for these advanced electrical systems may also increase. Including markers in flexible circuits enables quick and accurate identification of connections to individual circuits, which may reduce assembly and service time of a vehicle electrical system.

In some aspects, a flexible circuit is described including a wire conductor, an insulating body that protects the wire conductor, and a mark visible from the insulating body that indicates a connection between the wire conductor and a particular circuit within a vehicle electrical system.

In other aspects, a method for manufacturing a flexible circuit for a vehicle electrical system is described. The method includes a) marking a flexible circuit with a first mark to indicate a connection between a first flat-wire conductor of the flexible circuit and a first circuit within the vehicle electrical system, and b) marking the flexible circuit with a second mark to indicate a connection between a second flat-wire conductor of the flexible circuit and a second circuit within a vehicle electrical system.

In further aspects, a vehicle electrical system is described including a first circuit, a second circuit, and a flexible circuit. The vehicle electrical system further includes a first electrical connector coupling a first flat-wire conductor of the flexible circuit with the first circuit and a second electrical connector coupling a second flat-wire conductor of the flexible circuit with the second circuit. An insulating body of the flexible circuit protects the first and second flat-wire conductors. The flexible circuit includes a first mark visible from the insulating body that indicates a connection between the first flat-wire conductor and the first circuit, and a second mark visible from the insulating body that indicates a connection between the second flat-wire conductor and the second circuit.

This summary is provided to introduce simplified concepts for flexible circuits marked with connections to vehicle circuits, which is further described below in the Detailed Description and Drawings. For ease of description, the disclosure focuses on automotive systems; however, the techniques are not limited to automobiles but apply to flexible circuits of other types of vehicles and systems. This summary is not intended to identify essential features of the claimed subject matter, nor is it intended for use in determining the scope of the claimed subject matter.

BRIEF DESCRIPTION OF THE DRAWINGS

The details of one or more aspects of flexible circuits marked with connections to vehicle circuits are described in this document with reference to the following drawings. The same numbers are used throughout the drawings to reference like features and components.

DETAILED DESCRIPTION

Figure 1:
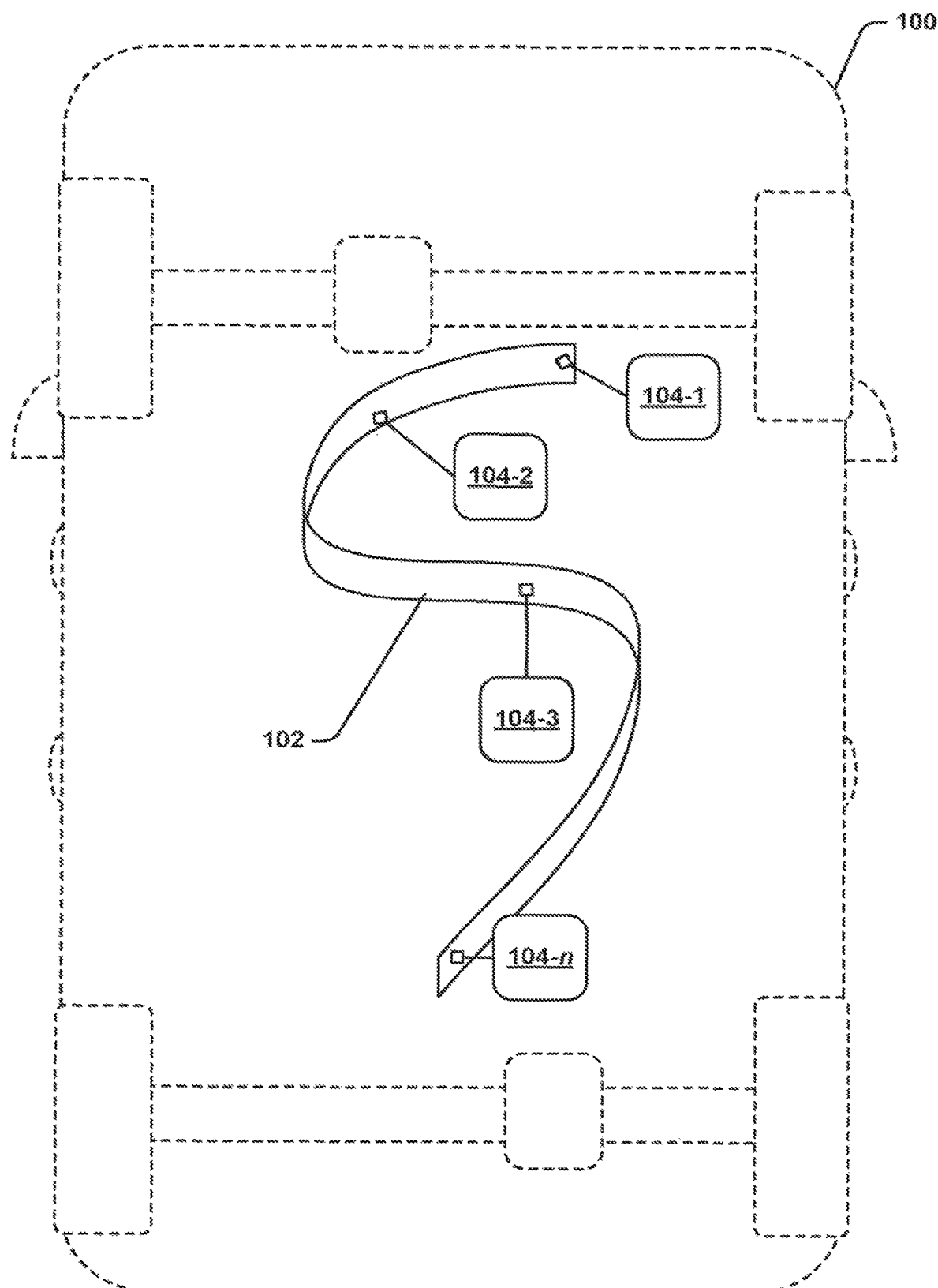
FIG. 1 illustrates an example vehicle in which flexible circuits marked with connections to vehicle circuits are implemented according to some implementations of the present disclosure.

Flexible circuits are described including markings that indicate connections between their flat-wire conductors and specific circuits of a vehicle electrical system. While flexible printed circuits are primarily discussed and shown herein, it will be appreciated that the present disclosure is directed to any type of flexible circuit. The conductive circuit traces or "flat-wire conductors" could be applied using any suitable deposition process, including, but not limited to, deposition processes (physical/chemical vapor deposition, sputtering, etc.) and printing processes (screen printing, lithography, inkjet, etc.). Wire conductors within a single flexible circuit may share connections with completely different circuits of the vehicle electrical system. To indicate a connection between a wire conductor and a vehicle circuit, the flexible circuit includes one or more human or machine-readable marks specifically indicating the connection, in some cases, indicating the connection at a position along the length of the conductor where the connection is to be made. The marks can include etchings or printings on the wire conductors or etchings or printings on the insulating body that protects the wire conductors. Including markers in the flexible circuits this way provides humans or machines with easily recognizable marks that pin-point connections to specific circuits to reduce service and assembly times of a vehicle electrical system.

In some implementations, laser coding (also referred to herein as "primary coding") can be automatically applied at little to no cost at the point of manufacture since the primary manufacturing method is laser-based. This may eliminate the need for additional/traditional/secondary coding/labeling at the final system/vehicle manufacturing facility. Primary coding could provide a fully integral individual/unique component/assembly traceability method. Primary coding could also be used to automatically identify individual assemblies and verify that individual assemblies are collated correctly to form larger assemblies. Primary coding could also provide a means of instruction for automatic processing equipment which could reduce/eliminate the need for equipment change over within a set of product types. Similar to a player piano roll, this could provide a recipe for the automatic processing equipment. Further, multiple primary codes could identify specific locations within individual assemblies digitally defining additional specific operations to be completed by automatic equipment. This technique could reduce equipment/controller complexity. Primary coding could also provide real time material supply/demand/inventory and pay point information. For example, coding can be read by a vision system on robotic end effector or static mounts. Coding may also be used to define operations during vehicle installation, ordering sequence of operations and verifying correct/complete electrical content installation.

In some implementations, manually legible/human readable alpha numeric codes can also be applied using primary laser marking methods. In yet other implementations, color coding (e.g., a color coded dot matrix) could be applied as a separate automatic process to provide legible circuit identification for some manufacturing use and in-vehicle service diagnosis.

FIG. 1 illustrates an example vehicle 100 in which flexible circuits marked with connections to vehicle circuits are implemented. Although outlined as an automobile, the vehicle 100 may be any vehicle in which flexible circuits are used to form connections between circuits.

The vehicle 100 includes a flexible circuit 102 which shares individual connections with a plurality of vehicle circuits 104-1 through 104-n (collectively "vehicle circuits 104"). Each of the vehicle circuits 104 includes at least one connector attached to the flexible circuit 102. Examples of the vehicle circuits 104 include lighting systems, climate control systems, automated or assistive driving systems, sensor systems, electrical drive systems, engine control systems, and any other electrical component that connects to a flexible circuit in a vehicle.

FIGS. 2 through 5 each illustrate aspects of example flexible circuits 102-1 through 102-4 marked to indicate connections to vehicle circuits. Each of the flexible circuits 102-1 through 102-4 is an example of flexible circuit 102 from FIG. 1.

Figure 2:
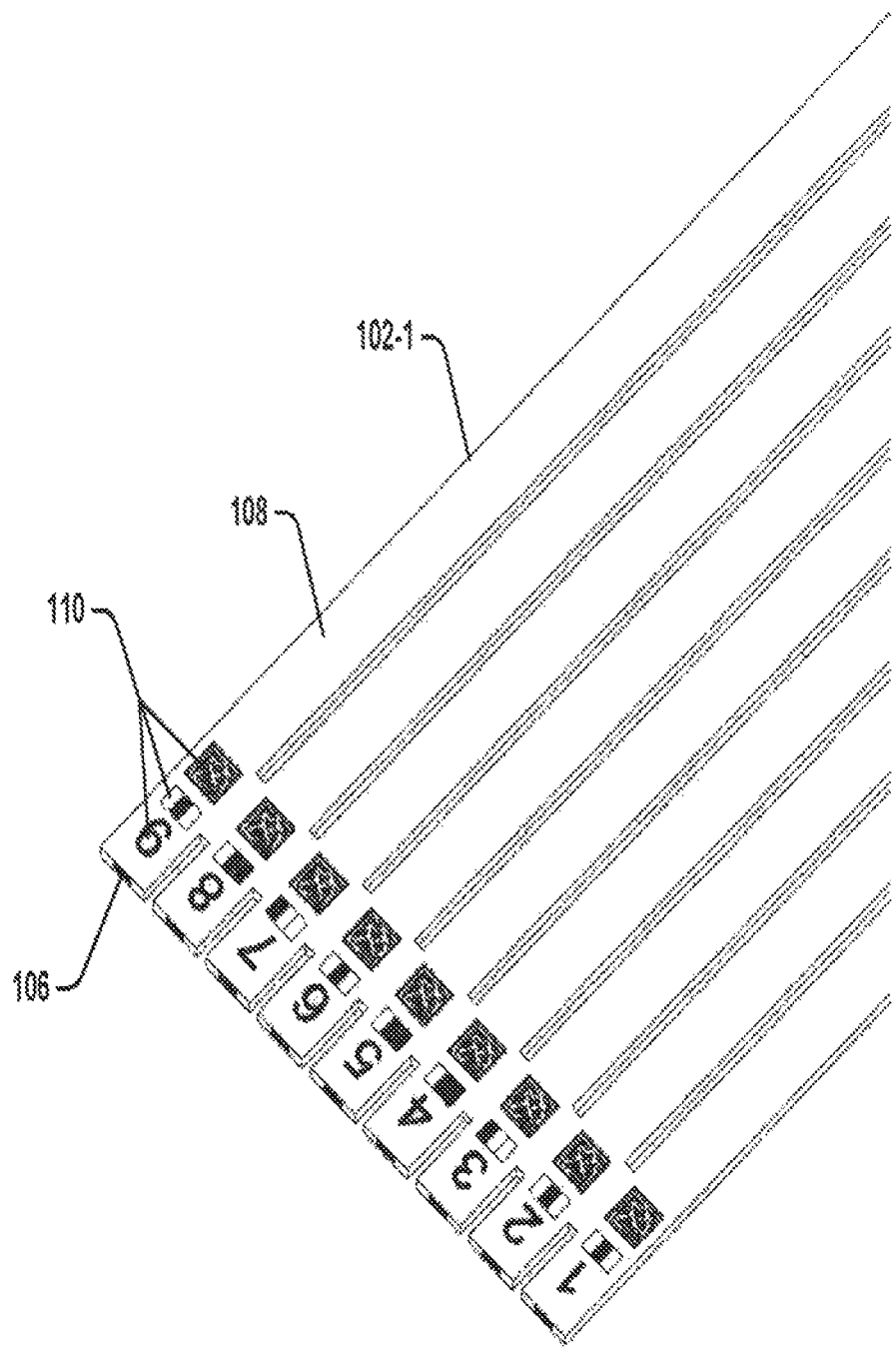
FIGS. 2 through 5 each illustrate aspects of example flexible circuits marked to indicate connections to vehicle circuits according to some implementations of the present disclosure.

In FIG. 2, a flexible circuit 102-1 includes an insulating body 108 that protects flat-wire conductors 106. The insulating body 108 can be formed generally from any non-conductive, flexible material, such as plastic. For example, the insulating body 108 may include two sheets of non-conductive material that are laminated together to encapsulate the flat-wire conductors. The flat-wire conductors 106 are provided by non-stranded electrically conductive material, e.g., aluminum and copper plated with tin.

The flexible circuit 102-1 includes nine flat-wire conductors 106 protected by the insulating body 108. Each of the conductors 106 includes a mark 110 that indicates a connection between that particular wire conductor 106 and a particular vehicle circuit 104 within the vehicle 100. The mark 110 can include a human-readable or machine-readable symbol, such as an alphanumeric code (e.g., a digit) or a barcode (e.g., a matrix barcode). Similar to the color codes used to indicate a level of resistance on a resistor, the mark 110 may include a color code (e.g., a sequence of colored bars or stripes) associated with a particular vehicle circuit 104 or location within the vehicle 100. To further aid in visual identification of the mark 110 or to be identifiable via touch, the mark 110 may be recessed into the insulating body 108 or raised from the insulating body 108. The mark 110 may include an etching, a printing, or other marking on a surface of the flat-wire conductors 106 that is identifiable through the insulating body 108. A surface of the insulating body 108 may itself include the etching, the printing, or the other marking associated with the mark 110. In some cases, the mark 110 includes a combination of marks made on the surfaces of the insulating body 108 and the wire-conductors 106. For instance, the mark 110 includes an etching cut into the wire-conductors 106 that after being enclosed by the insulating body 108 is colored with ink printing to further distinguish the mark 110 for a human or machine.

Figure 3:
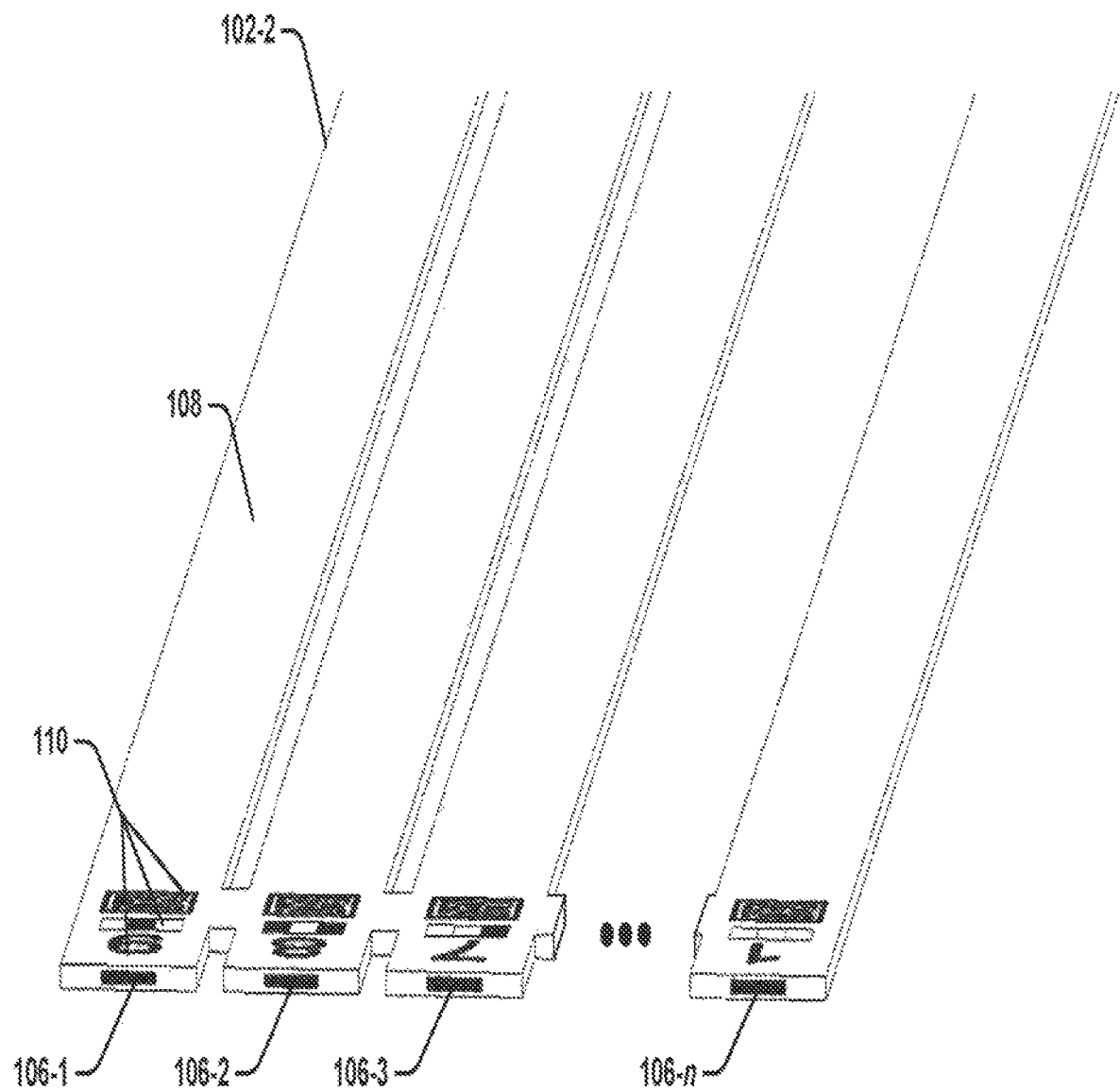

In FIG. 3, a flexible circuit 102-2 includes the insulating body 108, which in this example, protects flat-wire conductors 106-1 through 106-n. FIG. 3 illustrates how the flexible circuit 102-2 can include any number n of conductors. The insulating body 108 clearly surrounds each of the flat-wire conductors 106-1 through 106-n. The insulating body 108 protects the flat-wire conductors 106-1 through 106-n. Gaps in the insulating body 108 between each of the flat-wire conductors 106-1 through 106-n make each flat-wire conductor 106 discernable from the other. These gaps also isolate the flat-wire conductors 106-1 through 106-n and may provide an opening or edge in the flexible circuit 102-2 for attaching a connector. The mark 110 overlaying the wire conductor 106-1 indicates a connection between the wire conductor 106-1 and a particular vehicle circuit 104. Each of the other flat-wire conductors 106-2 through 106-n includes a unique mark similar to the mark 110 making other connections to the vehicle circuits 104 discernable through visual inspection of the flexible circuit 102-2.

Figure 4:
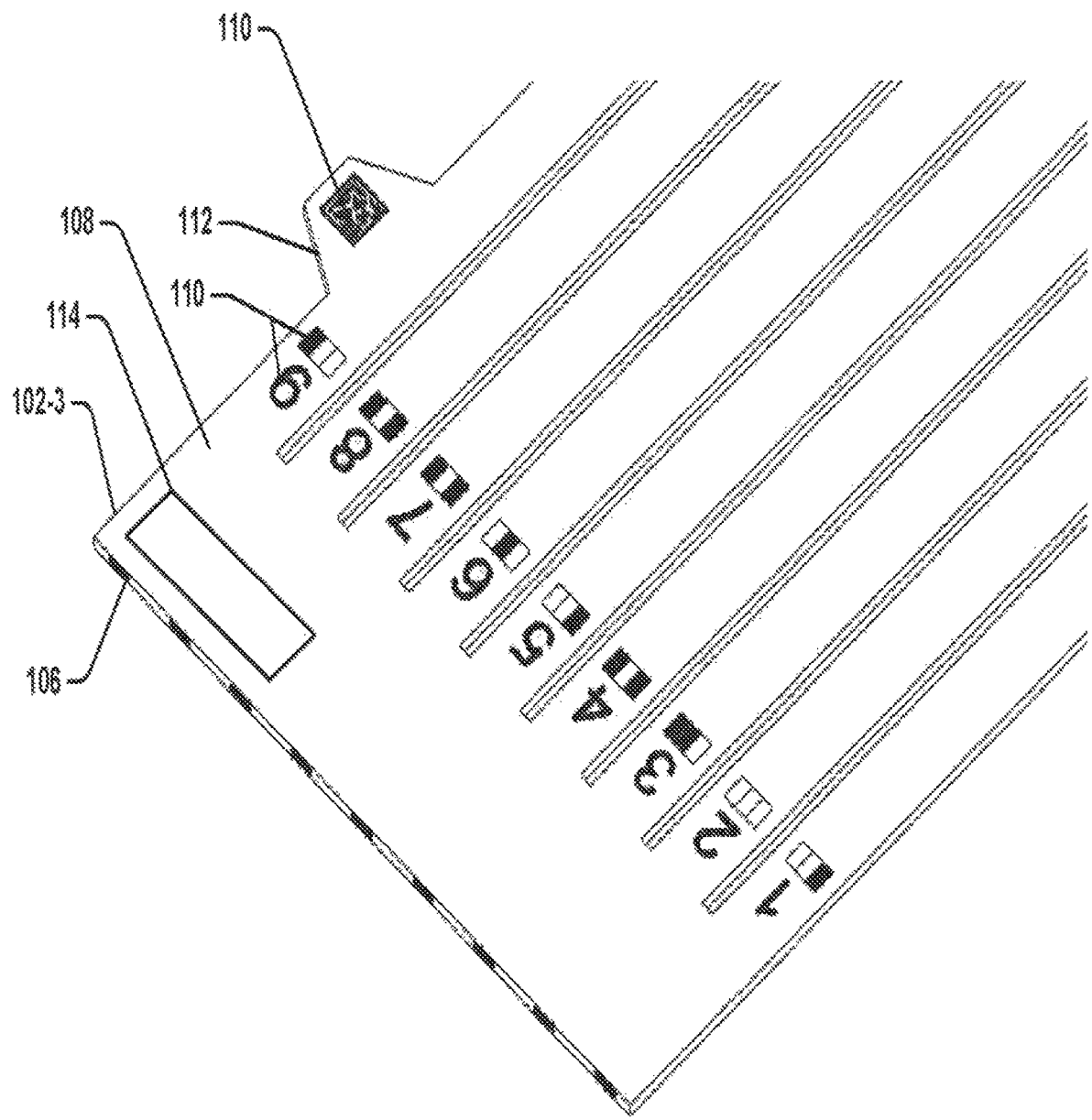

In FIG. 4, a flexible circuit 102-3 includes a feature 112 protruding from the insulating body 108. The feature 112 includes at least part of the mark 110 that indicates a specific connection to a particular vehicle circuit 104. For example, the part of the mark 110 located on the feature 112 specifies that connections to the flexible circuit 102-3 are to the vehicle circuit 104-1, and the respective part of the mark 110 located on or near each of the conductors 106 indicates a particular connection within the vehicle circuit 104-1.

FIG. 4 further shows an element 114 representing a part number or serial number associated with the flexible circuit 102-3. The element 114 is different and distinct from the mark 110 indicating the connections to the vehicle circuit 104-1. The part number or serial number within the element 114 differentiates the flexible circuit 102-3 from other parts within the vehicle 100. This, of course, is different than the marks 110 which indicate specific positions along the flexible circuit 102-3 where connections between the vehicle circuit 104-1 and the flexible circuit 102-3 are made.

Figure 5:
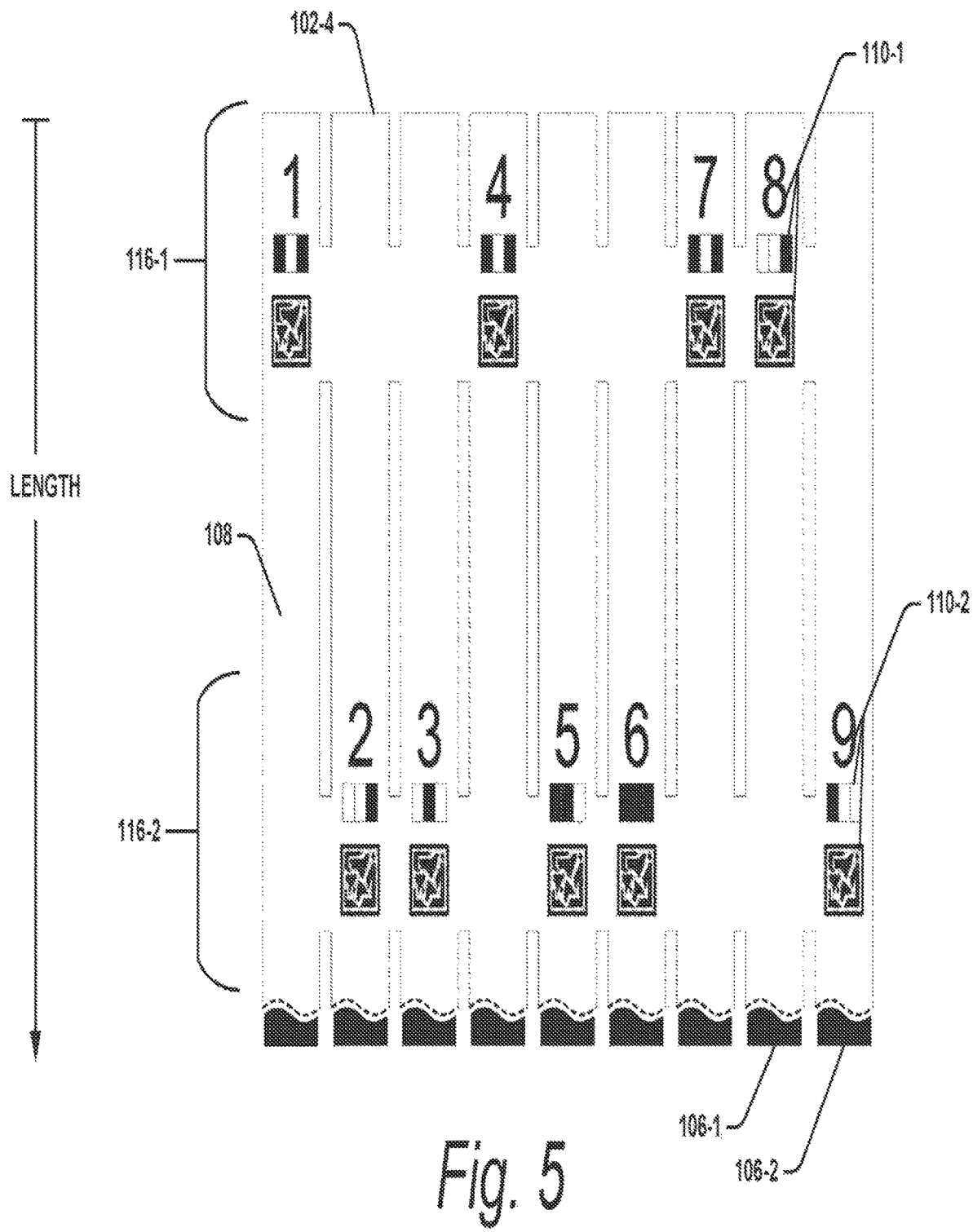

A flexible circuit 102-4 is shown in FIG. 5 and includes the marks 110-1 and 110-2. The mark 110-1 is at a different position 116-1 along a length of the flexible circuit 102-4 than the mark 110-2 and indicates where a connection between the conductor 106-1 and the vehicle circuit 104-1 is made. At position 116-2, the mark 110-2 indicates where a connection is made between the flat-wire conductor 106-2 and the vehicle circuit 104-2.

The vehicle 100 may include a first electrical connector attached to the flat-wire conductor 106-1 at or near the first mark 110-1 and may include a second electrical connector attached to the flat-wire conductor 106-2 at or near the second mark 110-2.

The marks 110-1 and 110-2 indicate locations where connections are made, possibly aiding in assembling and servicing of the vehicle 100. For example, the marks 110-1 and 110-2 include machine-readable codes that when scanned during a manufacturing process direct machinery to attach the first and second electrical connectors at the positions 116-1 and 116-2 along the length of the flexible circuit 102-4. In addition or as an alternative to machine-readable codes, the marks 110-1 and 110-2 may include color or alphanumeric codes that direct an assembler, such as a human technician or robotic machinery, where to attach the first and second electrical connectors at the positions 116-1 and 116-2 along the length of the flexible circuit 102-4. In this way, rather than analyzing a schematic or performing other complex diagnostic techniques to identify a connection to a circuit, the marks 110-1 and 110-2 allow for the identification of the connections through visual inspection. The flexible circuit 102-4 may further include a part number or assembly number (not shown). However, a part number or assembly number that differentiates the flexible circuit 102-4 from other parts of the vehicle is different than the marks 110-1 and 110-2 that each identify connections to specific circuits 104.

Figure 6:
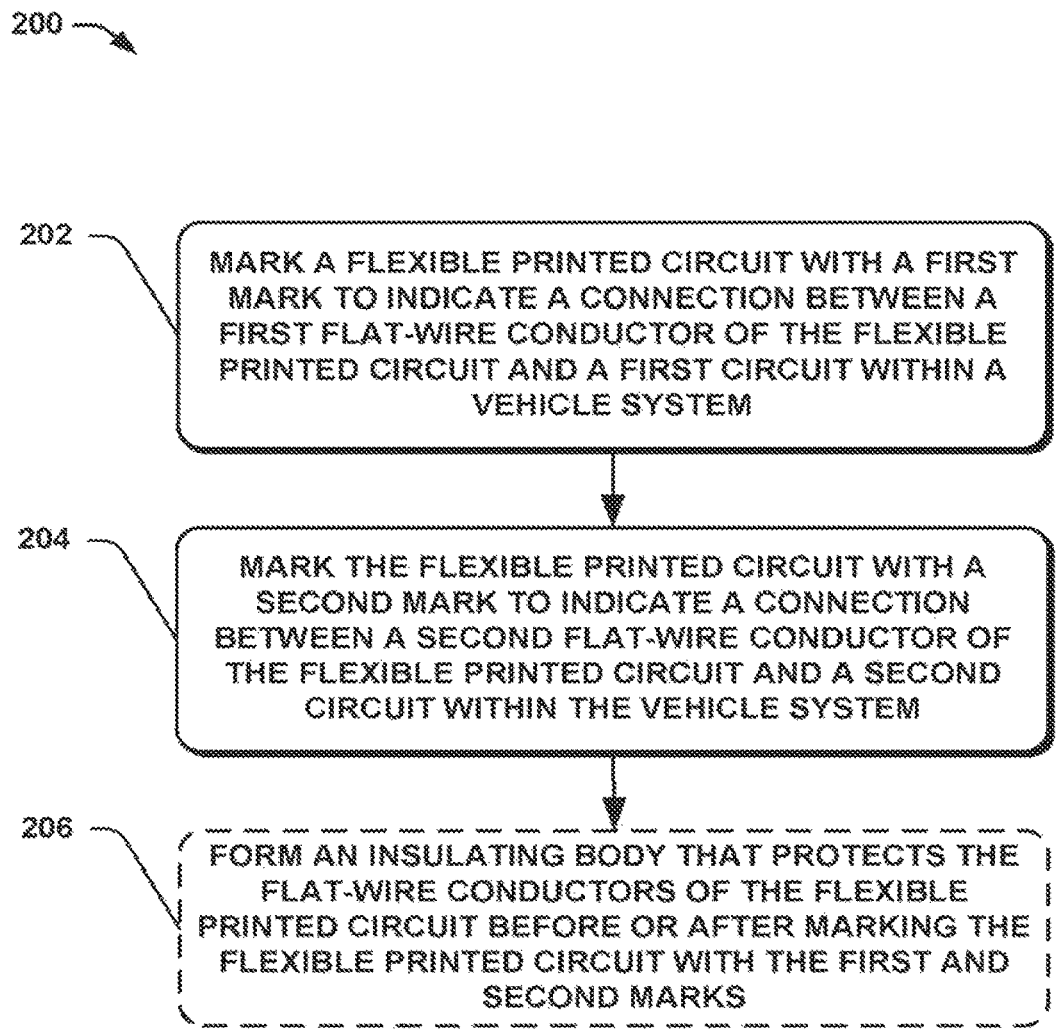
FIG. 6 illustrates an example process for manufacturing a flexible circuit with markings indicating connections to vehicle circuits according to some implementations of the present disclosure.

FIG. 6 illustrates an example process 200 for manufacturing a flexible circuit with markings indicating connections to vehicle circuits. FIG. 6 is described in the context of the flexible circuits 102-1 through 102-4. The process 200 includes steps 202 through 206 which may be performed in a different order than what is shown and may include additional or fewer steps.

A manufacturer of flexible circuits may perform the process 200. For example, a machine that receives reels of flat-wire conductor material and reels of non-conductive insulation material as inputs may perform the process 200 as part of a larger process the machine performs to generating a flexible circuit, such as the flexible circuits 102-1 through 102-4. The machine may perform laser cutting of the conductor material to shape the individual flat-wire conductors 106 and then laminate the flat-wire conductors 106 with the non-conductive material to form the insulating body 108.

At step 202, a flexible circuit is marked with a first mark to indicate a connection between a first flat-wire conductor of the flexible circuit and a first circuit within the vehicle electrical system. For example, during the laser cutting of the conductor material to shape the individual flat-wire conductors 106-1, the machine may use the same laser to etch the markings 110-1 into the surface of the individual flat-wire conductor 106-1. The machine may etch the mark 110-1 into the flat-wire conductor 106-1 at position 116-1 along a length of the flexible circuit 102-4 to indicate a connection between the flat-wire conductor 106-1 of the flexible circuit 102-4 and the circuit 104-1 within the vehicle 100.

At step 204, the flexible circuit is marked with a second mark to indicate a connection between a second flat-wire conductor of the flexible circuit and a second circuit within the vehicle electrical system. For example, during the laser cutting of the conductor material to shape the individual flat-wire conductor 106-2, the machine may use the same laser to etch the marking 110-2 into the surface of the individual flat-wire conductor 106-2. At position 116-2 along a length of the flexible circuit 102-4 the machine may etch the mark 110-2 into the flat-wire conductor 106-2 to indicate a connection between the flat-wire conductor 106-2 and the circuit 104-2 within the vehicle 100.

At step 206, an insulating body is optionally formed that protects the first and the second wire conductors. Step 206 may occur prior to steps 202 and 204, the insulating body 108 being formed over the flat-wire conductors 106-1 and 106-2 before marking the flexible circuit 102-4. Likewise, step 206 may occur after to steps 202 and 204, the insulating body 108 being formed over the flat-wire conductors 106-1 and 106-2 after marking the flexible circuit 102-4. For etching a marking with a laser or chemical, it may be preferable to form the insulating body 108 after etching the conductor, rather than etching the insulating body 108 that protects the conductor. For applying a laser or ink print type of marking, it may be preferable to form the insulating body 108 before or after marking the conductors 106. If marked before forming the insulating body 108, the insulating body 108 protects the mark 110 in addition to protecting the conductors 106.

By manufacturing flexible circuits with marks in this way, assembly and installation automation equipment (e.g., at a vehicle assembly plant) can rely on the marks as operational codes to perform work in a specific order and a specific manner of assembling a vehicle. This enables cheaper assembly of the vehicle and may reduce part number change and improve first-time quality.

The following are additional examples of flexible circuits marked with connections to vehicle circuits and applicable techniques.

Example 1

A flexible circuit comprising: a wire conductor; an insulating body that protects the wire conductor; and a mark visible from the insulating body that indicates a connection between the wire conductor and a particular circuit within a vehicle electrical system.

Example 2

The flexible circuit of example 1, further comprising: indicia containing a part number or serial number that differentiates the flexible circuit from other parts within the vehicle electrical system.

Example 3

The flexible circuit of example 1 or 2, wherein the wire conductor is a first wire conductor and the mark is a first mark, the flexible circuit further comprising: a second wire conductor protected by the insulating body; and a second mark that indicates a connection between the second wire conductor and the particular circuit or another circuit within the vehicle electrical system.

Example 4

The flexible circuit of the examples 3, wherein the first mark is at a different position along a length of the flexible circuit than the second mark.

Example 5

The flexible circuit of any of the examples 1 through 4, wherein the mark comprises a human-readable or machine-readable symbol.

Example 6

The flexible circuit of any of the examples 1 through 5, wherein the mark includes a color code having a plurality of different colors.

Example 7

The flexible circuit of any of the examples 1 through 6, wherein the mark is formed by a laser or ink printing on or within the insulating body.

Example 8

The flexible circuit of any of the examples 1 through 7, wherein the wire conductor is a flat-wire conductor and the mark comprises an etching or printing on a surface of the flat-wire conductor that is identifiable through the insulating body.

Example 9

The flexible circuit of any of the examples 1 through 8, wherein the mark is at a position along the flexible circuit where a connector attaches to form part of the connection between the wire conductor and the particular circuit.

Example 10

A method for manufacturing a flexible circuit for a vehicle electrical system, the method comprising: a) marking a flexible circuit with a first mark to indicate a connection between a first flat-wire conductor of the flexible circuit and a first circuit within the vehicle electrical system; and b) marking the flexible circuit with a second mark to indicate a connection between a second flat-wire conductor of the flexible circuit and a second circuit within a vehicle electrical system.

Example 11

The method of the example 10, further comprising: c) forming an insulating body that protects the first and the second wire conductors.

Example 12

The method of the example 11, wherein step c) occurs prior to steps a) and b).

Example 13

The method of the example 11, wherein step c) occurs after to steps a) and b).

Example 14

The method of any one of the examples 11 through 13, wherein step a) is performed by a laser or ink printing on the first flat-wire conductor or on the insulating body.

Example 15

The method of any one of the examples 11 through 14, step a) is performed by etching the first flat-wire conductor with the first mark before forming the insulating body.

Example 16

A vehicle electrical system comprising: a first circuit; a second circuit; a flexible circuit including: a first flat-wire conductor and a second flat-wire conductor; an insulating body that protects the first and second flat-wire conductors; a first mark that indicates a connection between the first flat-wire conductor and the first circuit; and a second mark that indicates a connection between the second flat-wire conductor and the second circuit; a first electrical connector coupling the first flat-wire conductor with the first circuit; and a second electrical connector coupling the second flat-wire conductor with the second circuit.

Example 17

The vehicle electrical system of the example 16, wherein the first electrical connector attaches to the first flat-wire conductor at or near the first mark and the second electrical connector attaches to the second flat-wire conductor at or near the second mark.

Example 18

The vehicle electrical system of any of the examples 16 or 17, wherein the first and second marks comprise machine-readable codes that direct machinery to attach the first and second electrical connectors to the flexible circuit when scanned during a manufacturing process.

Example 19

The vehicle electrical system of example 18, wherein the first and second marks comprise visible color or alphanumeric codes that direct an assembler where to attach the first and second electrical connectors to the flexible circuit.

Example 20

The vehicle electrical system of any of the examples 16 through 19, wherein the flexible circuit further comprises indicia of a part number or assembly number that is different than the first and second marks.

While various embodiments of the disclosure are described in the foregoing description and shown in the drawings, it is to be understood that this disclosure is not limited thereto but may be variously embodied to practice within the scope of the following claims. From the foregoing description, it will be apparent that various changes may be made without departing from the spirit and scope of the disclosure as defined by the following claims.

What is claimed is:
1. A flexible circuit comprising:
a first wire conductor;
a second wire conductor;
an insulating body that protects the first and second wire conductors;
a first mark visible on or through the insulating body that indicates a first connection between the first wire conductor and a particular circuit within a vehicle electrical system; and a second mark visible on or through the insulating body that indicates a second connection between the second wire conductor and the particular circuit or another circuit within the vehicle electrical system,
wherein the first mark is at a different position along a length of the insulating body than the second mark.

2. The flexible circuit of claim 1, further comprising:
indicia containing a part number or serial number that differentiates the flexible circuit from other parts within the vehicle electrical system.

3. The flexible circuit of claim 1, wherein at least one of the first and second marks comprises a human-readable or machine-readable symbol.

4. The flexible circuit of claim 1, wherein at least one of the first and second marks includes a color code having a plurality of different colors.

5. The flexible circuit of claim 1, wherein at least one of the first and second marks is formed by a laser or ink printing the respective mark on or within the insulating body.

6. The flexible circuit of claim 1, wherein at least one of the first and second wire conductors is a flat-wire conductor and at least one of the first and second marks comprises an etching or printing on a surface of the flat-wire conductor that is identifiable through the insulating body.

7. The flexible circuit of claim 1, wherein at least one of the first and second marks is at a position along the flexible circuit where at least one connector attaches to form part of the at least one of the first and second connections between the at least one of the first and second wire conductors and the particular circuit or the other circuit.

8. The flexible circuit of claim 1, wherein the first mark is proximate to a first end of the flexible circuit and the second mark is located proximate to a second opposing end of the flexible circuit or proximate to a midpoint between the first and second ends of the flexible circuit.

9. The flexible circuit of claim 1, wherein the first mark is proximate to a first midpoint between a first end of the flexible circuit and a second opposing end of the flexible circuit and the second mark is located proximate to the second opposing end of the flexible circuit or proximate to a second midpoint between the first midpoint and the second end of the flexible circuit, wherein the first and second midpoints are different.

10. A method for manufacturing a flexible circuit for a vehicle electrical system, the method comprising:
(a) marking a flexible circuit with a first mark to indicate a connection between a first flat-wire conductor of the flexible circuit and a first circuit within the vehicle electrical system; and
(b) marking the flexible circuit with a second mark to indicate a connection between a second flat-wire conductor of the flexible circuit and a second circuit within a vehicle electrical system,
wherein the first mark is at a different position along a length of the flexible circuit than the second mark.

11. The method of claim 10, further comprising:
(c) forming an insulating body that protects the first and the second flat-wire conductors, wherein each of the first and second marks is visible on or through the insulating body.

12. The method of claim 11, wherein step (c) occurs prior to steps (a) and (b).

13. The method of claim 11, wherein step (c) occurs after steps (a) and (b).

14. The method of claim 11, wherein step (a) is performed by laser or ink printing on the first flat-wire conductor or on the insulating body.

15. The method of claim 11, wherein step (a) is performed by etching the first flat-wire conductor with the first mark before forming the insulating body.

16. A vehicle electrical system comprising:
a first circuit;
a second circuit;
a flexible circuit including:
a first flat-wire conductor and a second flat-wire conductor;
an insulating body that protects the first and second flat-wire conductors;
a first mark visible on or through the insulating body that indicates a first connection between the first flat-wire conductor and the first circuit; and
a second mark visible on or through the insulating body that indicates a second connection between the second flat-wire conductor and the second circuit, wherein the first mark is at a different position along a length of the insulating body than the second mark;
a first electrical connector coupling the first flat-wire conductor with the first circuit to form the first connection; and
a second electrical connector coupling the second flat-wire conductor with the second circuit to form the second connection.

17. The vehicle electrical system of claim 16, wherein the first electrical connector attaches to the first flat-wire conductor at or near the first mark and the second electrical connector attaches to the second flat-wire conductor at or near the second mark.

18. The vehicle electrical system of claim 16, wherein the first and second marks comprise machine-readable codes that direct machinery to attach the first and second electrical connectors to the flexible circuit when scanned during a manufacturing process.

19. The vehicle electrical system of claim 18, wherein the first and second marks comprise visible color or alphanumeric codes that direct an assembler where to attach the first and second electrical connectors to the flexible circuit.

20. The vehicle electrical system of claim 16, wherein the flexible circuit further comprises indicia of a part number or assembly number that is different than the first and second marks.

* * * * *